(12) United States Patent
Weis et al.

(10) Patent No.: US 11,916,545 B2
(45) Date of Patent: Feb. 27, 2024

(54) OPERATING A POWER SEMICONDUCTOR ELEMENT

(71) Applicant: Siemens Aktiengesellschaft, Munich (DE)

(72) Inventors: Benno Weis, Hemhofen (DE); Fabian Diepold, Altmannstein (DE)

(73) Assignee: Siemens Aktiengesellschaft, Munich (DE)

( * ) Notice: Subject to any disclaimer, the term of this patent is extended or adjusted under 35 U.S.C. 154(b) by 242 days.

(21) Appl. No.: 17/296,868

(22) PCT Filed: Dec. 19, 2019

(86) PCT No.: PCT/EP2019/086150
§ 371 (c)(1),
(2) Date: May 25, 2021

(87) PCT Pub. No.: WO2020/136066
PCT Pub. Date: Jul. 2, 2020

(65) Prior Publication Data
US 2022/0021383 A1 Jan. 20, 2022

(30) Foreign Application Priority Data
Dec. 27, 2018 (EP) .................................... 18248049

(51) Int. Cl.
*H03K 17/14* (2006.01)
*G01R 19/175* (2006.01)
(Continued)

(52) U.S. Cl.
CPC ..... *H03K 17/145* (2013.01); *G01R 19/16538* (2013.01); *G01R 19/175* (2013.01); *H03K 17/302* (2013.01); *H03K 2017/0806* (2013.01)

(58) Field of Classification Search
CPC ............... H03K 17/145; H03K 17/302; H03K 2017/0806; G01R 19/16538; G01R 19/175
See application file for complete search history.

(56) References Cited

U.S. PATENT DOCUMENTS

2011/0304360 A1  12/2011  Miyachi et al.
2012/0194226 A1   8/2012  Itou et al.

FOREIGN PATENT DOCUMENTS

JP    2017169145 A  *  9/2017
NL        2020745 A     10/2018

OTHER PUBLICATIONS

PCT International Search Report and Written Opinion of International Searching Authority dated Mar. 9, 2020 corresponding to PCT International Application No. PCT/ EP2019/086150 filed Dec. 19, 2019.

* cited by examiner

*Primary Examiner* — Metasebia T Retebo
(74) *Attorney, Agent, or Firm* — Henry M. Felereisen LLC

(57) ABSTRACT

A method for operating a normally off or normally on power semiconductor element. A threshold voltage change in a threshold voltage of the power semiconductor element in relation to a reference threshold voltage is determined. A switch-on gate voltage is applied between a gate terminal and a source terminal of the power semiconductor element for the purpose of switching on the power semiconductor element is changed by the threshold voltage change in relation to a reference switch-on gate voltage corresponding to the reference threshold voltage.

18 Claims, 2 Drawing Sheets

(51) Int. Cl.
*H03K 17/30* (2006.01)
*H03K 17/08* (2006.01)
*G01R 19/165* (2006.01)

OPERATING A POWER SEMICONDUCTOR ELEMENT

CROSS-REFERENCES TO RELATED APPLICATIONS

This application is the U.S. National Stage of International Application No. PCT/EP2019/086150, filed Dec. 19, 2019, which designated the United States and has been published as International Publication No. WO 2020/136066 A1 and which claims the priority of European Patent Application, Serial No. 18248049.1, filed Dec. 27, 2018, pursuant to 35 U.S.C 119(a)-(d).

BACKGROUND OF THE INVENTION

The invention relates to a method for operating a self-locking or self-conducting power semiconductor element.

With specific self-locking or self-conducting power semiconductor elements, the active region of which is e.g. a gallium nitride layer and the substrate of which is manufactured from silicon or another material, the threshold voltage can change over the course of time. As a result, in the switched-on state of the power semiconductor element, the conduction losses increase if the power semiconductor element is always switched on with a defined switch-on gate voltage. Increasing the conduction losses reduces the efficiency of the power semiconductor element and can result in an overheating and in a failure.

NL 2020745 A discloses a switching element control circuit, which is configured to carry out a measuring mode, in which a threshold voltage of a switching element is measured, and a control mode, in which an ON/OFF operation of the switching element is controlled.

US 2012/194226 A1 discloses a switching element control apparatus, with which a switching element is actuated, by a voltage at its control terminal being controlled in response to characteristic information of the switching element. The apparatus contains a constant current circuit which impresses a constant current on the control terminal, a voltage limiting circuit, which limits the voltage at the control terminal to a critical voltage, and a control circuit, which controls the constant current circuit and the voltage limiting circuit, in order to apply the constant current to the control terminal if an actuation signal for switching on the switching element has been received and to limit the voltage at the control terminal for a voltage limiting duration. The control circuit has a storage unit, which stores the characteristic information, and, in response to the characteristic information, adjusts the critical voltage, the voltage limiting duration and/or the constant current.

US 2011/304360 A1 discloses a diode circuit with an anode terminal, a cathode terminal, a transistor, which has a gate terminal, a drain terminal and a source terminal, and a gate voltage generation circuit, which is connected between the gate terminal and the anode terminal and supplies a gate voltage which matches a threshold voltage of the transistor for the gate terminal.

The object underlying the invention is to specify an improved method for operating a self-locking or self-conducting power semiconductor element, the threshold voltage of which changes over the course of time.

SUMMARY OF THE INVENTION

The object is achieved according to the invention by a method as set forth hereinafter, and by a gate driver as set forth hereinafter.

Advantageous embodiments of the invention form the subject matter of the subclaims.

With the inventive method for operating a self-locking or self-conducting power semiconductor element, a threshold voltage change in a threshold voltage of the power semiconductor element is determined in relation to a reference threshold voltage, and a switch-on gate voltage applied between a gate terminal and a source terminal of the power semiconductor element for the purpose of switching on the power semiconductor element is changed by the threshold voltage change in relation to a reference switch-on gate voltage corresponding to the reference threshold voltage.

The invention therefore provides to determine a threshold voltage change in a threshold voltage of a power semiconductor element and to adjust a switch-on gate voltage for switching on the power semiconductor element to the modified threshold voltage, by the switch-on gate voltage being changed by the determined threshold voltage change. This prevents conduction losses in the power semiconductor element from increasing in the event of a change in the threshold voltage, by the change in the threshold voltage being offset a corresponding tracking of the switch-on gate voltage. In other words, the conduction losses of the power semiconductor element are kept independent of the change in the threshold voltage by tracking the switch-on gate voltage. As a result, aging of the power semiconductor element is slowed down and the service life of the power semiconductor element is advantageously increased. Moreover, a current state of the power semiconductor element can be determined and monitored by determining the threshold voltage change.

One embodiment of the invention provides that a test drain source voltage is measured in order to determine the threshold voltage change, said test drain source voltage occurring with a test switch-off gate voltage, e.g. with a gate voltage of zero, and a test reverse current between a drain terminal of the power semiconductor element and the source terminal, and a variation in the test drain source voltage from a reference drain source voltage being determined as a threshold voltage change, said variation occurring with the test switch-off gate voltage and the test reverse current between the drain terminal and the source terminal if the threshold voltage of the power semiconductor element matches the reference threshold voltage. A reverse current is understood to mean a current which has the technical current direction from the source terminal to the drain terminal of the power semiconductor element and is therefore opposite to a current flowing between the drain terminal and the source terminal when the power semiconductor element is switched on.

The afore-cited embodiment of the invention benefits from the fact that a threshold voltage change brings about a corresponding change in the drain source voltage, which occurs between a drain terminal of the power semiconductor element and the source terminal in the case of a test switch-off gate voltage and a test reverse current. The threshold voltage change can therefore be determined by a change in the drain source voltage being measured in relation to a reference drain source voltage in the case of the test switch-off gate voltage and the test reverse current. In particular, this embodiment of the invention advantageously enables the threshold voltage change, during operation of the power semiconductor element, to be determined and offset by the change in the switch-on gate voltage.

A further embodiment of the invention makes provision to apply the test switch-off gate voltage only briefly, e.g. less than one microsecond long, during the flow direction of the current in the reverse direction. As a result, for the remaining time of the reverse current flow in a pulse period of e.g. approx. 20 µs the gate voltage can be set to a positive value, which reduces the conduction losses.

A further embodiment of the invention provides that the threshold voltage change is transmitted to a higher-level computing unit, and a residual service life of the power semiconductor element is calculated from the threshold voltage change by the computing unit.

A further embodiment of the invention provides that the reference drain source voltage is measured when the power semiconductor element is in the state of its initial commissioning. In other words, this embodiment of the invention makes provision to determine the change in the drain source voltage in relation to a reference drain source voltage which the power semiconductor element had during its initial commissioning, in the case of the test switch-off gate voltage and the test reverse current. As a result, the threshold voltage change in the threshold voltage is also determined in relation to a reference threshold voltage of the power semiconductor during its initial commissioning and the switch-on gate voltage is changed in relation to a reference switch-on gate voltage of the power semiconductor element during its initial commissioning. As a result, the conduction losses of the power semiconductor element can be kept constant during its entire service life.

With a further embodiment of the invention, in the case that the power semiconductor element is arranged in a bridge arm of a half bridge, a further power semiconductor element is arranged in its other bridge arm, the test drain source voltage is only measured for the short time, while the two power semiconductor elements are switched off. This embodiment of the invention benefits from the fact that an alternating off time, in which both power semiconductor elements are switched off, is readily required for a safe operation of the half bridge in order to prevent cross bridge ignitions. This alternating off time then corresponds to the afore-cited brief duration during which the test switch-off gate voltage is applied. It is therefore advantageous to use this alternating off time to measure the test drain source voltage, since in this case, for the remaining part of a pulse period, in the case of a reverse current the gate voltage can also be set to a positive value, which reduces the conduction losses.

With a further embodiment of the invention, an active region of the power semiconductor element is manufactured from gallium nitride. With a further embodiment of the invention, the power semiconductor element is what is known as a high electron mobility transistor (HEMT). These embodiments of the invention take into account that precisely with a power semiconductor element with an active region consisting of gallium nitride, particularly with a power semiconductor element of this type embodied as an HEMT, the threshold voltage changes over the course of time. The inventive method is therefore particularly advantageously suited to operating a power semiconductor element of this type.

An inventive gate driver for carrying out the inventive method is embodied to change the switch-on gate voltage, which is applied between the gate terminal and the source terminal of the power semiconductor element for the purpose of switching on the power semiconductor element, by the threshold voltage change in relation to the reference switch-on gate voltage. A gate driver of this type makes it possible to track the switch-on gate voltage as a function of the threshold voltage change with the advantages already cited above.

For instance, the gate driver applies a test switch-off gate voltage to the gate terminal of the power semiconductor element, if a test reverse current flows between the source terminal and a drain terminal of the power semiconductor element.

Furthermore, the gate driver has a measuring unit, for instance, which is embodied to measure a test drain source voltage, which occurs between the drain terminal and the source terminal of the power semiconductor element, if the test reverse current flows between the drain terminal and the source terminal and the test switch-off gate voltage impresses on the gate terminal.

Moreover, provision can be made for the gate driver to store the value of the test drain source voltage last measured by the measuring unit.

Furthermore, provision can be made for the gate driver to form the switch-on gate voltage as a total of a reference gate voltage and the value of the test drain source voltage last measured by the measuring unit. The reference gate voltage is preferably selected so that the total of the reference gate voltage and the reference drain source voltage, which was measured between the drain terminal and the source terminal in the state of the initial commissioning of the power semiconductor element in the case of the test switch-off gate voltage and the test reverse current, produces the reference switch-on gate voltage.

BRIEF DESCRIPTION OF THE DRAWING

The above-described characteristics, features and advantages of this invention, as well as the manner in which these are realized will become more clearly and easily intelligible in connection with the following description of exemplary embodiments which are explained in more detail with reference to the drawings. The drawings show.

DETAILED DESCRIPTION OF PREFERRED EMBODIMENTS

Figure 1:
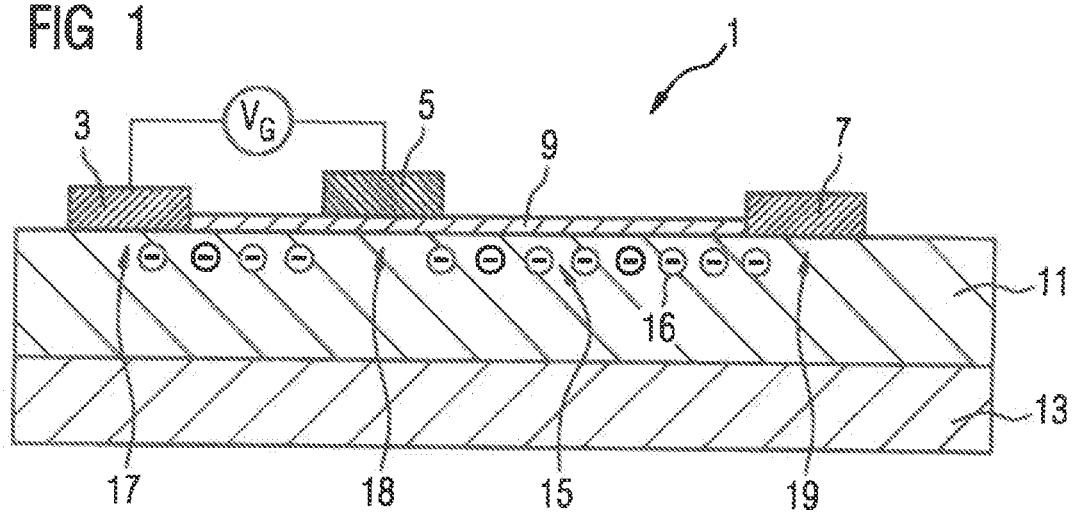
FIG. 1 a schematic sectional representation of a self-locking power semiconductor element, FIG. 2 a flow chart of the inventive method, FIG. 3 a circuit diagram of a half bridge circuit between two self-locking power semiconductor elements, FIG. 4 a circuit diagram of a gate driver according to the prior art, which controls a power semiconductor element, and FIG. 5 a circuit diagram of an exemplary embodiment of an inventive gate driver, which controls a power semiconductor element.

Parts which correspond to one another are provided with the same reference characters in the figures.

FIG. 1 shows a schematic sectional representation of a self-locking power semiconductor element 1, for instance. The power semiconductor element 1 (e.g. a gallium nitride switch embodied as an HEMI) has a source terminal 3, a gate terminal 5 and a drain terminal 7. An intermediate layer 9 made from aluminum gallium nitride (AlGaN) runs between the source terminal 3 and the drain terminal 7. The source terminal 3, the drain terminal 7 and the intermediate layer 9 are arranged on an active region 11, for instance a gallium nitride layer, which is applied to a carrier 13 (known as the substrate) made from silicon (Si), for instance. The gate terminal 5 is arranged on the intermediate layer 9 between the source terminal 3 and the drain terminal 7.

The power semiconductor element 1 typically conducts between the drain terminal 7 and the source terminal 3 in that below the intermediate layer 9 in the active region 11 due to the piezoelectric effect on account of a mechanical stress between the intermediate layer 9 and the active region 11, a conductive channel 15 made from electrons 16 forms between a point 17 below the source terminal 3 and a point 19 below the drain terminal 7. The point 17 defines the electric reference potential, to which the electric voltages subsequently relate. The channel 15 with concentrated electrons 16 is typically referred to as a two-dimensional electron gas layer (2DEG layer).

If the intermediate layer 9 is embodied thinner at one point or a negative electric potential is impressed onto a point 18 in the active region 11 below the gate terminal 5 as a result of a negative gate voltage $V_G$ between the gate terminal 5 and the source terminal 3, this interrupts the conductive channel 15. The extent of the introduced potential depends on the structure of the intermediate layer 9 and amounts for instance to −2V. If the potential at point 19 is zero or positive, the electrons 16 are repelled by the low potential at the point 18 and the channel 15 is interrupted. This blocks the power semiconductor element 1.

If the potential is now raised on the top side of the intermediate layer 9 by an external gate voltage $V_G$, the potential under the intermediate layer 9 can therefore increase again so that the electrons 16 are no longer repelled and a conductive channel 15 is produced again. The power semiconductor element 1 can therefore be switched on. The voltage, by which the potential has to be raised, in order to switch on the power semiconductor element 1, is referred to as a threshold voltage. The threshold voltage can change over the course of time e.g. by changes in the structure of the intermediate layer 9. If the power semiconductor element 1 is switched on with a same gate voltage $V_G$, an increase in the threshold voltage results in the potential at the point 18 increasing less than in the original state of the power semiconductor element 1 during its initial commissioning. In the switched-on state of the power semiconductor element 1, the conduction losses therefore increase, which reduces the efficiency of the circuit and may thus result in an overheating and a failure of the power semiconductor element 1.

During normal operation, the power semiconductor element 1 is switched off with a switch-off gate voltage of e.g. zero volts. Even with the switch-off gate voltage, a conductive channel 15 may however be embodied when the potential at the point 19 reduces by more than the threshold voltage. The potential at the point 19 is namely lower than at the point 18, where, in the switch-off state, it amounts to −2V, for instance. Electrons 16 therefore flow from the drain terminal 7 to the points 18 and 17 and form again a conductive channel 15 so that the power semiconductor element 1 conducts. A current of this type has the technical current direction from the source terminal 3 to the drain terminal 7 and is therefore referred to as reverse current, since it is opposite to a current flowing between the drain terminal 7 and the source terminal 3 when the power semiconductor element 1 is switched on.

Figure 2:
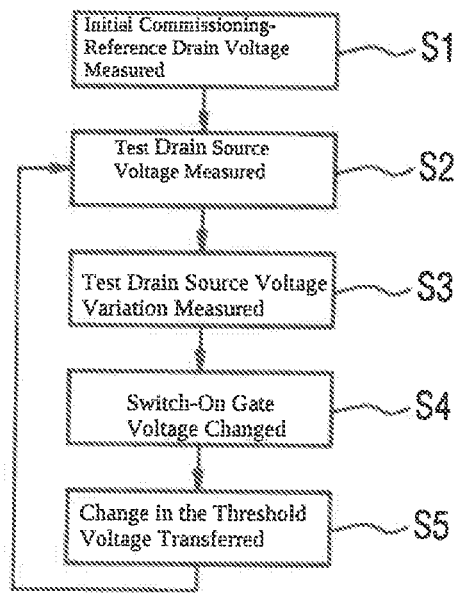

With a reverse current, the sum of the negative potential at the point 19 is composed of the threshold voltage and an ohmic voltage drop at the channel 15. Since the value of the ohmic voltage drop does not change with time, a threshold voltage change in the threshold voltage of the power semiconductor element 1 can therefore be determined by a change in the drain source voltage, which occurs with a defined test switch-off gate voltage of e.g. zero volts and a defined test reverse current between the drain terminal 7 and the source terminal 3. If, for example, one year after the initial commissioning of the power semiconductor element 1, with the test switch-off gate voltage and the test reverse current the drain source voltage amounts to −2 V instead of as originally (with the initial commissioning of the power semiconductor element 1) −1.5 V, it can be concluded that the threshold voltage has increased by 0.5 V. This is utilized in the method according to the invention, FIG. 2 shows a flow chart of the inventive method for operating a self-locking power semiconductor element 1 shown in FIG. 1.

In a first method step S1, in the state of the initial commissioning of the power semiconductor element 1, a reference drain source voltage is measured, which occurs with a test switch-off gate voltage of e.g. zero volts and a test reverse current between the drain terminal 7 and the source terminal 3.

In a second method step S2, a test drain source voltage which occurs with the same test switch-off gate voltage and the same test reverse current as in the first method step S1, is measured at a subsequent point in time.

In a third method step S3, a variation in the test drain source voltage measured in the second method step S2 from the reference drain source voltage measured in the first method step S1 is determined. This variation specifies the threshold voltage change in the threshold voltage of the power semiconductor element 1 in relation to a reference threshold voltage, which the power semiconductor element 1 had at the time of carrying out the first method step S1, in other words in the state of its initial commissioning.

In a fourth method step S4, a switch-on gate voltage, which is applied between the gate terminal 5 and the source terminal 3 of the power semiconductor element 1 for the purpose of switching on the power semiconductor element 1, is changed by the threshold voltage change, determined in the third method step S3, in relation to a reference switch-on gate voltage corresponding to the reference threshold voltage and with which the power semiconductor element 1 was switched on during its initial commissioning. When the threshold voltage is increased by 0.5 V in relation to the reference threshold voltage, for instance, the switch-on gate voltage is also raised by 0.5 V in relation to the reference switch-on gate voltage, and the power semiconductor element 1 is switched on with the changed switch-on gate voltage.

In an optional fifth method step S5, the change in the threshold voltage is transferred to a higher-level computing unit, which calculates a residual service life of the power semiconductor element 1 from this information.

After the fifth method step S5, the second method step S2 is carried out again after a suitably selected duration in order to check whether the threshold voltage has changed again and to adjust the switch-on gate voltage possibly to the changed threshold voltage and to recalculate the residual service life.

Figure 3:
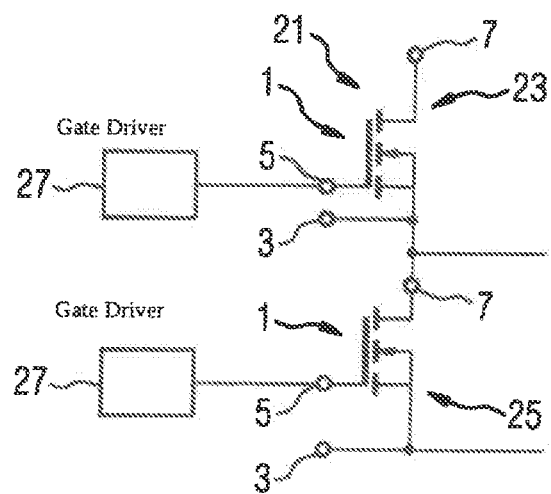

FIG. 3 shows a circuit diagram of a half bridge 21, in the bridge arms 23, 25 of which in each case a power semiconductor element 1 embodied as in FIG. 1 is arranged, the gate terminal 5 of which is actuated by a gate driver 27. The method described on the basis of FIG. 2 is carried out for each power semiconductor element 1. Here the second method step S2 is carried out in each case during an alternating off time, in which both power semiconductor elements 1 are switched off. This alternating off time is readily required for a safe operation of the half bridge 21, in order to prevent transverse bridge ignitions. In order to measure the test drain source voltage of a power semiconductor element 1, a brief storage of a voltage value can be carried out for instance between the drain terminal 7 and the source terminal 3 by means of a peak value recognition. Each gate driver 27 is embodied to change the switch-on gate voltage, which is applied between the gate terminal 5 and the source terminal 3 of the power semiconductor element 1 in order to switch on the respective power semiconductor element 1, by the threshold voltage change, which is determined in the third method step S3 of the method described on the basis of FIG. 2, in relation to the reference switch-on gate voltage, and to switch on the power semiconductor element 1 with the changed switch-on gate voltage.

Figure 4:
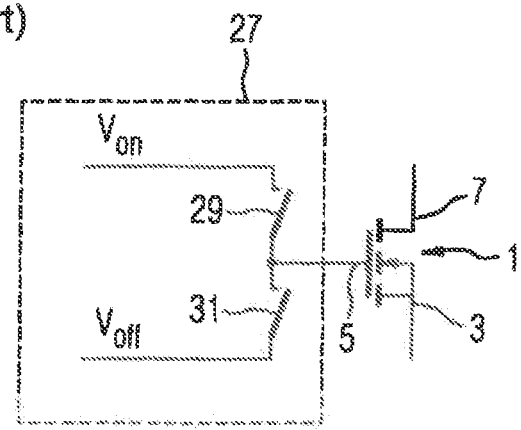

FIG. 4 shows a schematic representation of a gate driver 27 according to the prior art, which controls a power semiconductor element 1 embodied as in FIG. 1. The gate driver 27 has two switches 29, 31 for actuating the gate terminal 5 of the power semiconductor element 1. In order to switch on the power semiconductor element 1, a first switch 29 is closed and the second switch 31 is opened, as a result of which a switch-on gate voltage $V_{on}$ is applied to the gate terminal 5. In order to switch off the power semiconductor element 1, the first switch 29 is opened and the second switch 31 is closed, as a result of which a switch-off gate voltage $V_{on}$ is applied to the gate terminal 5. The switch-on gate voltage $V_0$ remains unchanged during the entire operating time of the power semiconductor element 1.

Figure 5:
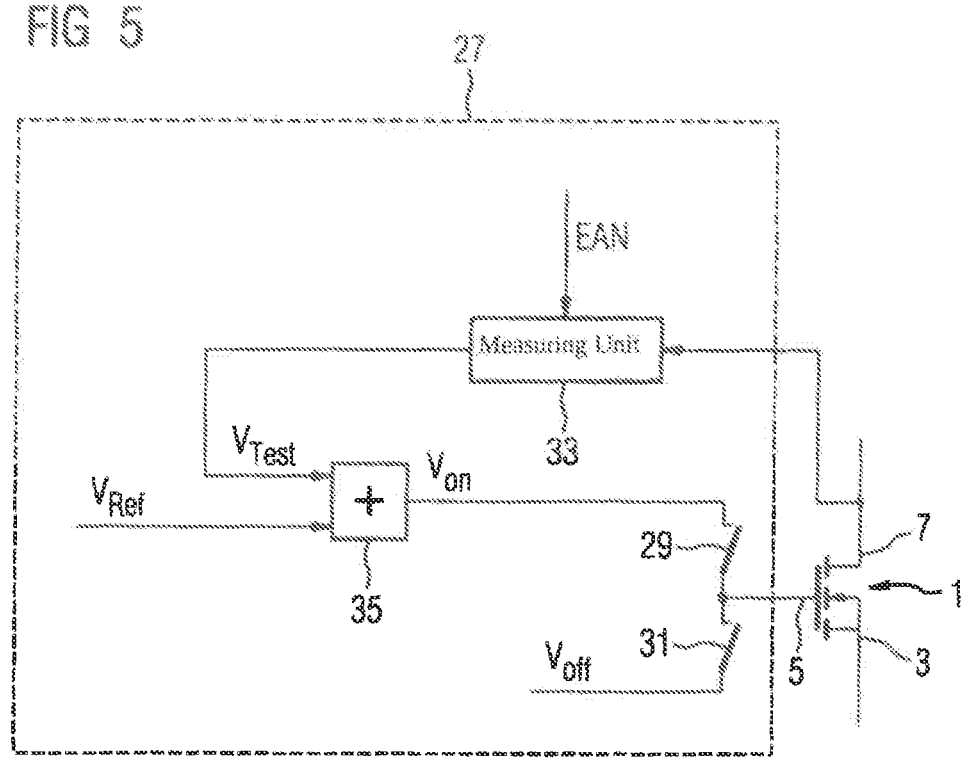

FIG. 5 shows a schematic representation of an exemplary embodiment of an inventive gate driver 27, which controls a power semiconductor element 1 embodied as in FIG. 1 and is embodied to carry out the method described with the aid of FIG. 2. In addition to the components of a gate driver 27 according to the prior art, the gate driver 27 has a measuring unit 33 and an adding unit 35.

If the test reverse current flows between the drain terminal 7 and the source terminal 3 of the power semiconductor element 1, the gate driver 27 applies the test switch-off gate voltage as a switch-off gate voltage $V_{off}$ to the gate terminal 6 by way of the second switch 31 when the first switch 29 is opened and uses the measuring unit 33 to measure a test drain source voltage $V_{Test}$ which occurs between the drain terminal 7 and the source terminal 3, The measured value of the test drain source voltage $V_{Test}$ is stored by the measuring unit 33 until the next measurement of the test drain source voltage $V_{rest}$.

The measuring unit 33 is embodied for instance as what is known as a saturation monitoring circuit which is known from the prior art. The measuring unit 33 is activated and deactivated by an enable signal EAN, which can assume an activation value and a deactivation value. The enable signal EAN is only then set to the activation value when the test reverse current flows between the drain terminal 7 and the source terminal 3, and the test switch-off gate voltage impresses on the gate terminal 5. If the enable signal EAN assumes the activation value, the test drain source voltage $V_{Test}$ is measured by the measuring unit 33 and the measured value of the test drain source voltage $V_{Test}$ is stored. When the enable signal EAN assumes the deactivation value, the last stored value of the test drain source voltage $V_{Test}$ is output from an output of the measuring unit 33 to the adding unit 35.

In order to switch on the power semiconductor element 1, a switch-on gate voltage V is applied to the gate terminal 5 by way of the first switch 29 when the second switch 31 is opened, said switch-on gate voltage $V_{on}$ being formed by the adding unit 35 as a total of a reference gate voltage $V_{Ref}$ and the value of the test drain source voltage $V_{Test}$ last stored by the measuring unit 33. The adding unit 35 can either be embodied using analog or digital technology.

The reference gate voltage $V_{Ref}$ is preferably selected so that in total with the reference drain source voltage, which was measured between the drain terminal 7 and the source terminal 3 in the state of the initial commissioning of the power semiconductor element 1 in the case of the test switch-off gate voltage and the test reverse current, the reference switch-on gate voltage is produced. If the test drain source voltage $V_{Test}$ now changes over the course of time, the switch on gate voltage $V_{on}$ is tracked accordingly.

Although the invention has been illustrated and described in detail based on preferred exemplary embodiments, the invention is not restricted by the examples given and other variations can be derived therefrom by a person skilled in the art without departing from the protective scope of the invention.

What is claimed is:

1. A method for operating a self-locking or self-conducting power semiconductor element, the method comprising:
   measuring a test drain source voltage occurring with a test switch-off gate voltage and a test reverse current between a drain terminal and a source terminal of the power semiconductor element;
   determining a variation in the test drain source voltage from a reference drain source voltage as a threshold voltage change, said variation occurring between the drain terminal and the source terminal with the test switch-off gate voltage when a threshold voltage of the power semiconductor element matches a reference threshold voltage;
   determining the threshold voltage change in the threshold voltage of the power semiconductor element in relation to the reference threshold voltage; and
   changing a switch-on gate voltage, which is applied between a gate terminal and the source terminal of the power semiconductor element for the purpose of switching on the power semiconductor element, by the threshold voltage change in relation to a reference switch-on gate voltage corresponding to the reference threshold voltage.

2. The method of claim 1, wherein the test switch-off gate voltage amounts to zero volts.

3. The method of claim 1, wherein the test drain source voltage is less than one microsecond long.

4. The method of claim 1 further comprising:
   transferring the threshold voltage change to a higher-level computing unit; and
   calculating with the computing unit a residual service life of the power semiconductor element using the threshold voltage change.

5. The method of claim 1, further comprising measuring the reference drain source voltage when the power semiconductor element is in a state of its initial commissioning.

6. The method of claim 1, further comprising measuring the test drain source voltage while the power semiconductor element arranged in a bridge arm of a half bridge and a further power semiconductor element arranged in another bridge arm of the half bridge are both switched off.

7. The method of claim 1, wherein an active region of the power semiconductor element is manufactured from gallium nitride.

8. The method claim 1, wherein the power semiconductor element is a high electron mobility transistor.

9. A gate driver, configured to:
   measure a test drain source voltage occurring with a test switch-off gate voltage and a test reverse current between a drain terminal and a source terminal of a power semiconductor element;

determine a variation in the test drain source voltage from a reference drain source voltage as a threshold voltage change, said variation occurring between the drain terminal and the source terminal with the test switch-off gate voltage when a threshold voltage of the power semiconductor element matches a reference threshold voltage;

determine the threshold voltage change in the threshold voltage of the power semiconductor element in relation to the reference threshold voltage; and change a switch-on gate voltage, which is applied between a gate terminal and the source terminal of the power semiconductor element for the purpose of switching on the power semiconductor element, by the threshold voltage change in relation to a reference switch-on gate voltage corresponding to the reference threshold voltage.

10. The gate driver of claim 9, configured to apply the test switch-off gate voltage to the gate terminal of the power semiconductor element when the test reverse current flows between the source terminal and the drain terminal of the power semiconductor element.

11. The gate driver of claim 10, comprising a measuring unit configured to measure the test drain source voltage, which occurs between the drain terminal and the source terminal of the power semiconductor element, when the test reverse current flows between the drain terminal and the source terminal and the test switch-off gate voltage is impressed on the gate terminal.

12. The gate driver claim 11, configured to store a value of the test drain source voltage last measured by the measuring unit.

13. The gate driver of claim 12, configured to form the switch-on gate voltage as a total of a reference gate voltage and the value of the test drain source voltage last measured by the measuring unit.

14. A gate driver, comprising:
a measurement unit having an input operatively coupled to a drain terminal of a power semiconductor element and an output providing a test drain source voltage;

an adding unit having a first input operatively coupled to the measuring unit output for receiving the test drain source voltage, a second input operatively coupled to a reference gate voltage, and an output providing a switch on gate voltage formed by a total of the first and second inputs;

a first switch operatively coupled on one end to the output of the adding unit and on another end to a gate terminal of the power semiconductor element; and a second switch operatively coupled on one end to the another end of the first switch and the gate terminal of the power semiconductor element and on another end to a switch off gate voltage;

wherein the gate driver applies the switch on gate voltage to the gate terminal of the power semiconductor element when the first switch is closed and the second switch is opened, and applies the switch off gate voltage to the gate terminal of the power semiconductor element when the first switch is opened and the second switch is closed.

15. The gate driver of claim 14, wherein the measuring unit measures a test drain source voltage at the input of the measuring unit when the gate driver applies a test switch off gate voltage as the switch off gate voltage and a test reverse current flows between the drain terminal and a source terminal of the power semiconductor element; said measuring unit determining a variation in the test drain source voltage from a reference drain source voltage as a threshold voltage change, said variation occurring between the drain terminal and the source terminal of the power semiconductor element with the test switch off gate voltage applied when a threshold voltage of the power semiconductor element matches a reference threshold voltage; said measuring unit determining a threshold voltage change in the threshold voltage of the power semiconductor element in relation to the reference threshold voltage; and the adding unit changing the switch on gate voltage by the threshold voltage change in relation to a reference switch on gate voltage corresponding to the reference threshold voltage.

16. The gate driver of claim 15, wherein the measuring unit is configured to store a value of the test drain source voltage last measured by the measuring unit.

17. The gate driver of claim 16, wherein the adding unit forms the switch on gate voltage at the adding unit output as a total of the test drain source voltage last measured by the measuring unit at the first input and reference gate voltage at the second input.

18. The gate driver of claim 17, wherein the measuring unit is activated by an enable signal having an activation value when the test reverse current flows and the test switch off gate voltage is applied and deactivated by the enable signal having a deactivation value, said measuring unit measuring and storing the test drain source voltage when activated, and said measuring unit outputting the stored last measured value of the test drain source voltage to the adding unit first input when deactivated.

* * * * *